(12) United States Patent
Farnworth

(10) Patent No.: US 7,833,456 B2
(45) Date of Patent: Nov. 16, 2010

(54) SYSTEMS AND METHODS FOR COMPRESSING AN ENCAPSULANT ADJACENT A SEMICONDUCTOR WORKPIECE

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 754 days.

(21) Appl. No.: 11/678,507

(22) Filed: Feb. 23, 2007

(65) Prior Publication Data

US 2008/0206930 A1 Aug. 28, 2008

(51) Int. Cl.
*H01L 21/56* (2006.01)
(52) U.S. Cl. .............. 264/272.17; 264/272.15; 264/279; 438/127
(58) Field of Classification Search .......... 264/279, 264/272.15, 272.17; 438/127
See application file for complete search history.

(56) References Cited

U.S. PATENT DOCUMENTS

| | | |
|---|---|---|
| 3,672,046 A | 6/1972 | Storey, II et al. |
| 4,012,307 A | 3/1977 | Phillips |
| 4,285,780 A | 8/1981 | Schachter |
| 4,473,516 A | 9/1984 | Hunerberg |
| 4,569,814 A | 2/1986 | Chong et al. |
| 4,769,344 A | 9/1988 | Sakai et al. |
| 4,770,833 A | 9/1988 | Hughes |
| 4,777,520 A | 10/1988 | Nambu et al. |
| 4,814,137 A | 3/1989 | Beuchel et al. |
| 4,855,807 A | 8/1989 | Yamaji et al. |
| 4,866,506 A | 9/1989 | Nambu et al. |
| 4,882,212 A | 11/1989 | SinghDeo et al. |
| 4,887,149 A | 12/1989 | Romano |
| 4,996,587 A | 2/1991 | Hinrichsmeyer et al. |
| 5,043,199 A | 8/1991 | Kubota et al. |
| 5,107,328 A | 4/1992 | Kinsman |
| 5,128,831 A | 7/1992 | Fox, III et al. |
| 5,138,434 A | 8/1992 | Wood et al. |
| 5,147,821 A | 9/1992 | McShane et al. |
| 5,191,174 A | 3/1993 | Chang et al. |
| 5,192,682 A | 3/1993 | Kodai et al. |

(Continued)

FOREIGN PATENT DOCUMENTS

EP 0392042 10/1990

(Continued)

OTHER PUBLICATIONS

Van Zant, P., *Microchip Fabrication*, Fourth Edition, McGraw-Hill, New York, Chapter 18, Packaging, Copyright 2000, pp. 557-593.

(Continued)

*Primary Examiner*—Joseph S Del Sole
*Assistant Examiner*—David N Brown, II
(74) *Attorney, Agent, or Firm*—Perkins Coie LLP

(57) ABSTRACT

Systems and methods for compressing an encapsulant adjacent a semiconductor workpiece are disclosed. A method in accordance with one aspect includes placing a semiconductor workpiece and an encapsulant in a mold cavity and driving some of the encapsulant from the mold cavity to an overflow chamber. The method can further include applying pressure to the encapsulant in the mold cavity via pressure applied to the encapsulant in the overflow chamber.

36 Claims, 5 Drawing Sheets

U.S. PATENT DOCUMENTS

| | | | |
|---|---|---|---|
| 5,195,023 A | 3/1993 | Manzione et al. |
| 5,197,183 A | 3/1993 | Chia et al. |
| 5,208,467 A | 5/1993 | Yamazaki |
| 5,266,748 A | 11/1993 | Kawakami et al. |
| 5,296,738 A | 3/1994 | Freyman et al. |
| 5,309,026 A | 5/1994 | Matsumoto |
| 5,314,842 A | 5/1994 | Sawaya et al. |
| 5,326,243 A | 7/1994 | Fierkens |
| 5,344,600 A | 9/1994 | McShane et al. |
| 5,363,280 A | 11/1994 | Chobot et al. |
| 5,365,655 A | 11/1994 | Rose |
| 5,431,854 A | 7/1995 | Pas et al. |
| 5,449,427 A | 9/1995 | Wojnarowski et al. |
| 5,474,958 A | 12/1995 | Djennas et al. |
| 5,527,743 A | 6/1996 | Variot |
| 5,578,261 A | 11/1996 | Manzione et al. |
| 5,593,927 A | 1/1997 | Farnworth et al. |
| 5,596,231 A | 1/1997 | Combs |
| 5,596,321 A | 1/1997 | Hekstra et al. |
| 5,606,204 A | 2/1997 | Tsuji |
| 5,609,889 A | 3/1997 | Weber |
| 5,612,576 A | 3/1997 | Wilson et al. |
| 5,635,220 A | 6/1997 | Izumi et al. |
| 5,665,281 A | 9/1997 | Drummond |
| 5,665,296 A | 9/1997 | Jain et al. |
| 5,677,566 A | 10/1997 | King et al. |
| 5,696,033 A | 12/1997 | Kinsman |
| 5,710,071 A | 1/1998 | Beddingfield et al. |
| 5,721,450 A | 2/1998 | Miles |
| 5,728,600 A | 3/1998 | Saxelby, Jr. et al. |
| 5,739,585 A | 4/1998 | Akram et al. |
| 5,750,423 A | 5/1998 | Ishii |
| D394,844 S | 6/1998 | Farnworth et al. |
| 5,766,649 A | 6/1998 | Azuma |
| 5,767,446 A | 6/1998 | Ha et al. |
| 5,773,322 A | 6/1998 | Weld |
| 5,793,613 A | 8/1998 | Poinelli et al. |
| 5,796,159 A | 8/1998 | Kierse |
| 5,801,073 A | 9/1998 | Robbins et al. |
| 5,811,879 A | 9/1998 | Akram |
| 5,815,000 A | 9/1998 | Farnworth et al. |
| 5,817,535 A | 10/1998 | Akram |
| D402,638 S | 12/1998 | Farnworth et al. |
| 5,842,275 A | 12/1998 | McMillan, II et al. |
| 5,851,845 A | 12/1998 | Wood et al. |
| 5,866,953 A | 2/1999 | Akram et al. |
| 5,888,443 A | 3/1999 | Bolanos et al. |
| 5,891,753 A | 4/1999 | Akram |
| 5,893,726 A | 4/1999 | Farnworth et al. |
| 5,894,167 A | 4/1999 | Moden et al. |
| 5,898,224 A | 4/1999 | Akram |
| 5,917,234 A | 6/1999 | Tsuruzono |
| 5,920,768 A | 7/1999 | Shintai |
| 5,928,595 A | 7/1999 | Knapp et al. |
| 5,932,254 A * | 8/1999 | Mitchell et al. ............ 425/117 |
| 5,933,713 A | 8/1999 | Farnworth |
| 5,938,956 A | 8/1999 | Hembree et al. |
| 5,945,130 A | 8/1999 | Saxelby, Jr. et al. |
| 5,946,553 A | 8/1999 | Wood et al. |
| 5,952,611 A | 9/1999 | Eng et al. |
| 5,955,115 A | 9/1999 | Bolanos et al. |
| 5,958,100 A | 9/1999 | Farnworth et al. |
| 5,964,030 A | 10/1999 | Lee et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 5,998,243 A | 12/1999 | Odashima et al. |
| 6,000,603 A * | 12/1999 | Koskenmaki et al. ....... 228/246 |
| 6,000,924 A | 12/1999 | Wang et al. |
| 6,008,070 A | 12/1999 | Farnworth |
| 6,013,946 A | 1/2000 | Lee et al. |
| 6,015,987 A | 1/2000 | Arita et al. |
| 6,020,629 A | 2/2000 | Farnworth et al. |
| 6,025,728 A | 2/2000 | Hembree et al. |
| 6,028,365 A | 2/2000 | Akram et al. |
| 6,038,136 A | 3/2000 | Weber |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,049,129 A | 4/2000 | Yew et al. |
| 6,054,755 A | 4/2000 | Takamichi et al. |
| 6,063,650 A | 5/2000 | King et al. |
| 6,066,514 A | 5/2000 | King et al. |
| 6,071,457 A | 6/2000 | Bednarz et al. |
| 6,071,758 A | 6/2000 | Steffen |
| 6,072,236 A | 6/2000 | Akram et al. |
| 6,075,288 A | 6/2000 | Akram |
| 6,089,920 A | 7/2000 | Farnworth et al. |
| 6,094,058 A | 7/2000 | Hembree et al. |
| 6,097,087 A | 8/2000 | Farnworth et al. |
| 6,100,114 A * | 8/2000 | Milkovich et al. .......... 438/127 |
| 6,100,598 A | 8/2000 | Kanesaka |
| 6,103,547 A | 8/2000 | Corisis et al. |
| 6,107,122 A | 8/2000 | Wood et al. |
| 6,107,680 A | 8/2000 | Hodges |
| 6,114,189 A | 9/2000 | Chia et al. |
| 6,117,382 A | 9/2000 | Thummel |
| 6,124,634 A | 9/2000 | Akram et al. |
| 6,126,428 A | 10/2000 | Mitchell et al. |
| 6,143,581 A | 11/2000 | Johnson et al. |
| 6,150,717 A | 11/2000 | Wood et al. |
| 6,159,764 A | 12/2000 | Kinsman et al. |
| 6,168,970 B1 | 1/2001 | Burns |
| 6,172,419 B1 | 1/2001 | Kinsman |
| 6,172,423 B1 | 1/2001 | Lee et al. |
| 6,175,159 B1 | 1/2001 | Sasaki |
| 6,184,465 B1 | 2/2001 | Corisis |
| 6,191,472 B1 | 2/2001 | Mazumder |
| 6,198,172 B1 | 3/2001 | King et al. |
| 6,201,299 B1 | 3/2001 | Tao et al. |
| 6,203,319 B1 | 3/2001 | Lee |
| 6,203,967 B1 | 3/2001 | Westbrook et al. |
| 6,208,519 B1 | 3/2001 | Jiang et al. |
| 6,210,992 B1 | 4/2001 | Tandy et al. |
| 6,215,175 B1 | 4/2001 | Kinsman |
| 6,218,731 B1 | 4/2001 | Huang et al. |
| 6,228,548 B1 | 5/2001 | King et al. |
| 6,228,687 B1 | 5/2001 | Akram et al. |
| 6,229,202 B1 | 5/2001 | Corisis |
| 6,235,994 B1 | 5/2001 | Chamberlin et al. |
| 6,242,802 B1 | 6/2001 | Miles et al. |
| 6,246,108 B1 | 6/2001 | Corisis et al. |
| 6,251,703 B1 | 6/2001 | Van Campenhout et al. |
| 6,252,298 B1 | 6/2001 | Lee et al. |
| 6,258,623 B1 | 7/2001 | Moden et al. |
| 6,258,624 B1 | 7/2001 | Corisis |
| 6,259,153 B1 | 7/2001 | Corisis |
| 6,262,480 B1 | 7/2001 | Ferri et al. |
| 6,268,650 B1 | 7/2001 | Kinsman et al. |
| 6,277,671 B1 | 8/2001 | Tripard |
| 6,284,571 B1 | 9/2001 | Corisis et al. |
| 6,288,444 B1 | 9/2001 | Abe et al. |
| 6,291,884 B1 | 9/2001 | Glenn et al. |
| 6,291,894 B1 | 9/2001 | Farnworth et al. |
| 6,291,895 B1 | 9/2001 | Taniguchi et al. |
| 6,294,839 B1 | 9/2001 | Mess et al. |
| 6,299,053 B1 | 10/2001 | Kamath et al. |
| 6,300,163 B1 | 10/2001 | Akram |
| 6,300,165 B2 | 10/2001 | Castro |
| 6,303,981 B1 | 10/2001 | Moden |
| 6,303,985 B1 | 10/2001 | Larson et al. |

| | | | |
|---|---|---|---|
| 6,306,331 B1* | 10/2001 | Lajza et al. ............ 264/272.13 |
| 6,309,916 B1 | 10/2001 | Crowley et al. |
| 6,310,390 B1 | 10/2001 | Moden |
| 6,314,639 B1 | 11/2001 | Corisis |
| 6,315,936 B1 | 11/2001 | Black et al. |
| 6,316,285 B1 | 11/2001 | Jiang et al. |
| 6,324,069 B1 | 11/2001 | Weber |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,326,700 B1 | 12/2001 | Bai et al. |
| 6,329,220 B1 | 12/2001 | Bolken et al. |
| 6,329,603 B1 | 12/2001 | Japp et al. |
| 6,331,221 B1 | 12/2001 | Cobbley |
| 6,331,453 B1 | 12/2001 | Bolken et al. |
| 6,332,766 B1 | 12/2001 | Thummel |
| 6,338,813 B1 | 1/2002 | Hsu et al. |
| 6,343,019 B1 | 1/2002 | Jiang et al. |
| 6,349,582 B2 | 2/2002 | Tanaka et al. |
| 6,385,049 B1 | 5/2002 | Chia-Yu et al. |
| 6,403,009 B1 | 6/2002 | Saxelby, Jr. et al. |
| 6,407,381 B1 | 6/2002 | Glenn et al. |
| 6,413,801 B1 | 7/2002 | Lin |
| 6,423,470 B1 | 7/2002 | Scheibner et al. |
| 6,444,500 B1* | 9/2002 | Shinma ..................... 438/127 |
| 6,451,709 B1 | 9/2002 | Hembree |
| 6,462,883 B1 | 10/2002 | Wang et al. |
| 6,472,252 B2 | 10/2002 | Mess |
| 6,483,044 B1 | 11/2002 | Ahmad |
| 6,503,780 B1 | 1/2003 | Glenn et al. |
| 6,525,412 B2 | 2/2003 | Noshita et al. |
| 6,534,861 B1 | 3/2003 | Castro |
| 6,549,821 B1* | 4/2003 | Farnworth et al. .......... 700/120 |
| 6,558,600 B1 | 5/2003 | Williams et al. |
| 6,562,278 B1* | 5/2003 | Farnworth et al. .......... 264/401 |
| 6,589,820 B1 | 7/2003 | Bolken |
| 6,630,730 B2 | 10/2003 | Grigg |
| 6,653,173 B2 | 11/2003 | Bolken |
| 6,664,139 B2 | 12/2003 | Bolken |
| 6,677,675 B2 | 1/2004 | Bolken |
| 6,683,388 B2 | 1/2004 | Bolken |
| 6,688,774 B2 | 2/2004 | Kullin et al. |
| 6,734,571 B2 | 5/2004 | Bolken |
| 6,781,066 B2 | 8/2004 | Heng et al. |
| 6,796,028 B2 | 9/2004 | Ahmad |
| 6,838,760 B1 | 1/2005 | Cobbley |
| 6,933,170 B2 | 8/2005 | Heng et al. |
| 6,979,595 B1 | 12/2005 | James et al. |
| 6,982,386 B2 | 1/2006 | Ahmad |
| 6,983,551 B2 | 1/2006 | Ahmad |
| 7,049,685 B2 | 5/2006 | James et al. |
| 7,101,737 B2 | 9/2006 | Cobbley |
| 2001/0030382 A1 | 10/2001 | Lajza, Jr. et al. |
| 2001/0038144 A1 | 11/2001 | Grigg |
| 2002/0006686 A1 | 1/2002 | Cloud et al. |
| 2002/0135050 A1* | 9/2002 | Kimura ..................... 257/668 |
| 2002/0164391 A1 | 11/2002 | Shinma |
| 2003/0147185 A1 | 8/2003 | Regala, IV et al. |
| 2003/0209831 A1 | 11/2003 | Williams et al. |
| 2003/0235663 A1 | 12/2003 | Williams et al. |
| 2004/0101631 A1 | 5/2004 | Uragami et al. |
| 2005/0064065 A1* | 3/2005 | Seng et al. ................. 425/577 |
| 2005/0238747 A1* | 10/2005 | Chandra ..................... 425/127 |
| 2006/0180907 A1 | 8/2006 | James et al. |
| 2006/0261498 A1 | 11/2006 | James |
| 2007/0063335 A1 | 3/2007 | Cobbley |

FOREIGN PATENT DOCUMENTS

| | | |
|---|---|---|
| EP | 1746642 A2 | 1/2007 |
| JP | 60-208847 | 10/1985 |
| JP | 62-032622 | 2/1987 |
| JP | 62-229949 | 10/1987 |
| JP | 1-244629 | 9/1989 |
| JP | 5-299536 | 11/1993 |
| JP | 10-065043 | 3/1998 |
| JP | 11-017048 | 1/1999 |
| JP | 11-026489 | 1/1999 |
| JP | 11-077733 | 3/1999 |
| JP | 2000-106375 | 4/2000 |
| JP | 2001-076689 | 3/2001 |
| JP | 2001-085565 | 3/2001 |
| KR | 2001-038773 | 5/2001 |
| WO | 03044850 A1 | 5/2003 |

OTHER PUBLICATIONS

Garrou, P., "Wafer-Level Packaging Has Arrived," IEEE Components, Packaging and Manufacturing Technologies Society, Semiconductor International, Oct. 1, 2000.

Apic Yamada Corporation, Molding System, 3 pages, <http://www.apicyamada.co.jp/english/product/main01.html>.

International Search Report and Written Opinion for International Application No. PCT/US2008/054069.

* cited by examiner

US 7,833,456 B2

SYSTEMS AND METHODS FOR COMPRESSING AN ENCAPSULANT ADJACENT A SEMICONDUCTOR WORKPIECE

TECHNICAL FIELD

The present disclosure is related to systems and methods for compressing an encapsulant adjacent a semiconductor workpiece.

BACKGROUND

Many packaged microelectronic devices have a substrate, a microelectronic die attached to the substrate, and a protective covering or encapsulant encasing the die. The protective covering is generally a plastic or epoxy compound that can be molded to form a casing over the die. The microelectronic die can be a memory device, a microprocessor, or another type of microelectronic assembly having integrated circuitry. Several types of packaged devices also include bond pads on the substrate that are coupled to the integrated circuitry of the die. The bond pads may alternatively be coupled to pins or other types of terminals that are exposed on the exterior of the microelectronic device for connecting the die to buses, circuits, and/or other microelectronic assemblies.

A significant limiting process when manufacturing packaged microelectronic devices is encapsulating the die with the protective covering. The dies are sensitive components that should be protected from physical contact and potentially harmful environmental conditions to avoid damaging the die. The protective casing encapsulating the die, therefore, should seal the die from the external environment and shield the die from electrical and mechanical shocks. Thus, the protective casing should not have any voids that may allow contaminants or other harmful agents to contact and potentially damage the die.

One conventional technique for encapsulating dies is known as transfer molding, and involves placing the die in a cavity of a mold and then injecting a thermoset material into the cavity. FIG. 1A illustrates a representative transfer molding tool 10 that simultaneously encases a plurality of microelectronic dies 60. More specifically, the molding tool 10 can include an upper plate 30 removably positioned on a lower plate 20 to define a plurality of substrate chambers 14. A plurality of channels 16 connect the substrate chambers 14 to an upright pellet cylinder 17. A cylindrical pellet 40 formed from an epoxy mold compound is positioned in the cylinder 17, and a plunger 15 moves upwardly within the cylinder 17 to transfer heat and exert pressure against the pellet 40. The heat and pressure from the plunger 15 liquefy the mold compound of the pellet 40. The liquefied mold compound flows through the channels 16 (as indicated by arrows F) and into the substrate chambers 14 to surround the microelectronic dies 60. As the liquefied mold compound flows into the substrate chambers 114, it drives out the air within the molding tool through small vents 18. This is known as the transfer stage of the process. During a subsequent compaction stage, pressure is exerted on the encapsulant within the substrate chambers 14 to collapse microvoids that may be present within the encapsulant. The mold compound in the substrate chambers 14 is then cooled and hardened to form a protective casing around each microelectronic die 60.

Another conventional technique for encapsulating dies is compression molding, illustrated schematically in FIG. 1B. During a compression molding process, the die 60 is placed on a lower plate 20, the encapsulant 40 is placed on the die 60, and an upper plate 30 is brought downwardly toward the lower plate 20. The upper plate 30 and the lower plate 20 together form a substrate chamber 14. As the upper plate 30 contacts the encapsulant 40, it forces the encapsulant 40 around the die 60. The amount of encapsulant 40 placed on the die 60 is typically slightly more than is necessary to fully encapsulate the die 60, so as to ensure complete encapsulation. Accordingly, the excess encapsulant 40 escapes from the substrate chamber 14 through escape channels 19.

As part of a continuing effort to streamline the process for manufacturing microelectronic devices, many processes which formerly were performed on singulated microelectronic dies are now being performed on unsingulated dies, including entire wafers of such dies. These processes are typically referred to as wafer-level processing techniques. In some cases, wafer-level processing has been used to at least partially encapsulate the dies at the wafer level. However, existing encapsulation techniques have been difficult to implement at the wafer level. For example, the wafers typically include solder balls, wirebonds, or other conductive structures for connecting the dies to other devices. When a wafer containing such conductive structures is placed in a transfer mold, the rapid flow of encapsulant over the surface of the wafer can sweep away or otherwise disturb the position, shape and/or orientation of these conductive structures. The compression molding process can also suffer from drawbacks. For example, when an encapsulant is disposed on a wafer having solder balls, wirebonds, or other small conductive structures, small pockets of air can be trapped between the encapsulant and the small conductive structures. However, because the compression mold is not completely sealed (so as to allow excess mold compound to escape from the mold cavity via the escape channels 19), the encapsulant in the mold cavity cannot be compacted to collapse these voids. Therefore, for at least the foregoing reasons, it is desirable to improve the process for forming protective casings over microelectronic devices.

DETAILED DESCRIPTION

Specific details of several embodiments of the disclosure are described below with reference to semiconductor workpieces and systems for processing the workpieces. The workpieces can include micromechanical components, data storage elements, optics, read/write components, or other features. For example, the workpieces can include wafers having dies including SRAM, DRAM (e.g., DDR-SDRAM), flash-memory (e.g., NAND flash-memory), processor, imager, and other dies. Moreover, several other embodiments of the invention can have configurations, components, or procedures different than those described in this section. A person of ordinary skill in the art, therefore, will accordingly understand that the invention may have other embodiments with additional elements, or the invention may have other embodiments without several of the elements shown and described below with reference to FIG. 2A-8.

A particular method for encapsulating a semiconductor workpiece includes placing the workpiece and an encapsulant in a mold cavity and driving some of the encapsulant from the mold cavity to an overflow chamber. The method can further include applying pressure to the encapsulant in the mold cavity via pressure applied to the encapsulant in the overflow chamber. A representative apparatus suitable for conducting such a method includes a mold element bounding a mold cavity that is positioned to receive a semiconductor workpiece and an encapsulant. The apparatus further includes an overflow chamber in flow communication with the mold cavity. A first pressurizing device is coupled to the mold cavity. A second pressurizing device is operatively coupled to the overflow chamber and, via the overflow chamber, the mold cavity. Accordingly, the first pressurizing device can pressurize the mold cavity to distribute the encapsulant adjacent the workpiece and drive excess encapsulant into the overflow chamber. The second pressurizing device can then pressurize the encapsulant, e.g., to reduce or eliminate microvoids.

Figure 1A:
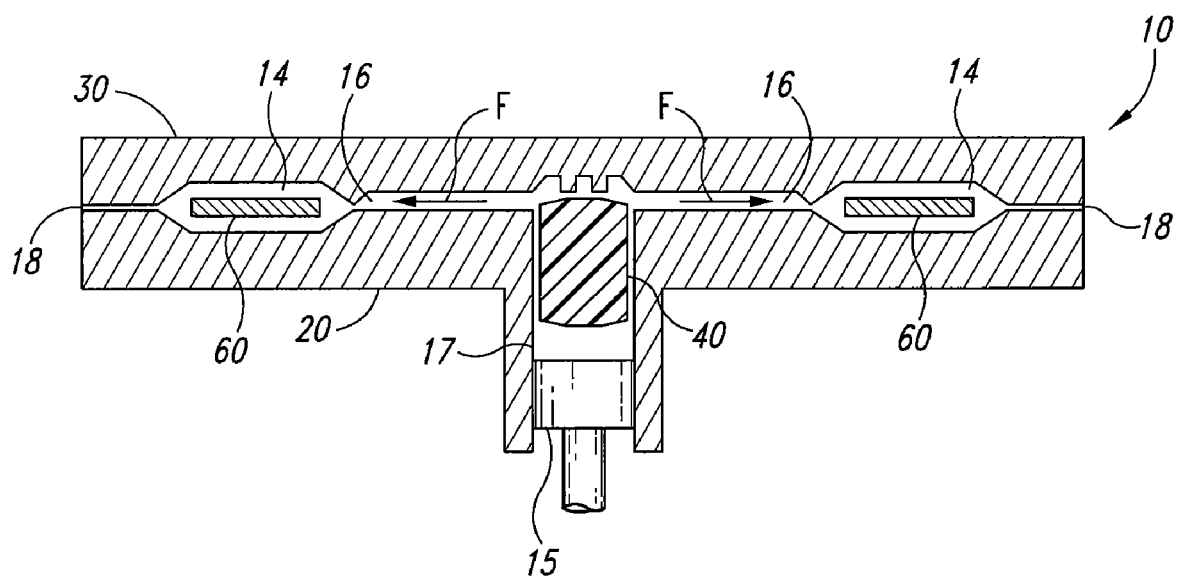
FIG. 1A is a partially schematic, cross-sectional side view of a molding apparatus for encapsulating microelectronic devices using a transfer mold process in accordance with the prior art.
Figure 1B:
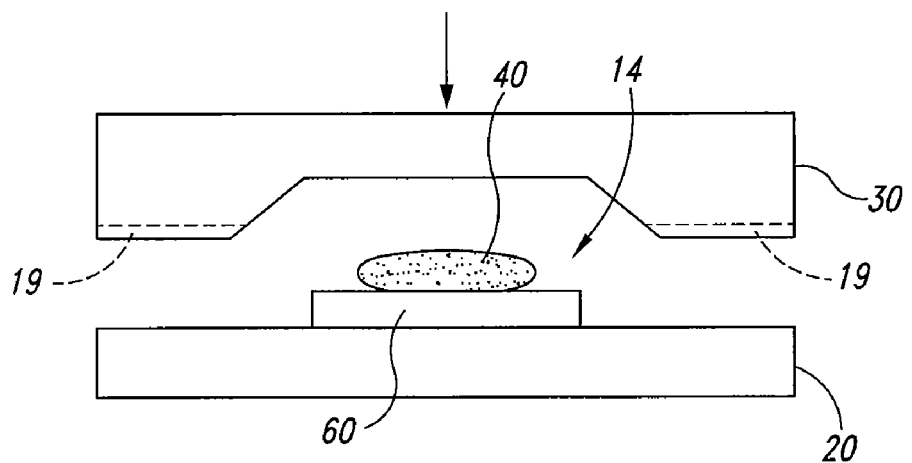
FIG. 1B is a partially schematic, cross-sectional side view of a molding apparatus for encapsulating microelectronic devices using a compression process in accordance with the prior art.
Figure 2A:
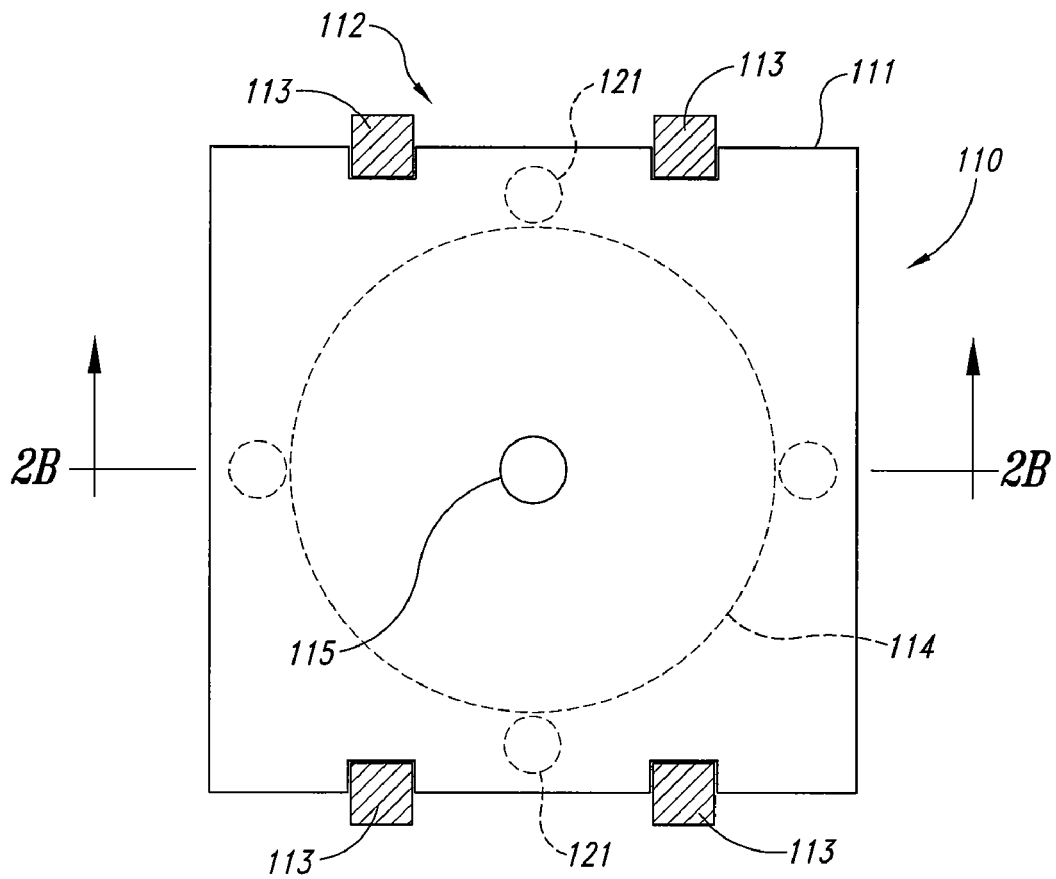
FIG. 2A is a partially schematic, top view of a tool for encapsulating semiconductor workpieces in accordance with an embodiment of the invention.

FIG. 2A is a partially schematic top view of a tool 110 for processing semiconductor workpieces in accordance with one embodiment of the disclosure. The illustrated tool 110 includes a mold 111 having a mold cavity 114 that houses the workpiece. One or more overflow chambers 121 can be positioned around the periphery of the mold cavity 114, in flow communication with the mold cavity 114 so as to receive some of the encapsulant placed in the mold cavity 114. A mold actuator 115 can drive one part of the mold 111 relative to another. Accordingly, the driven part of the mold 111 can operate as the first pressurizing device described above. A guide structure 112 (shown schematically) can include one or more guide elements 113 that align the motion of the mold components.

Figure 2B:
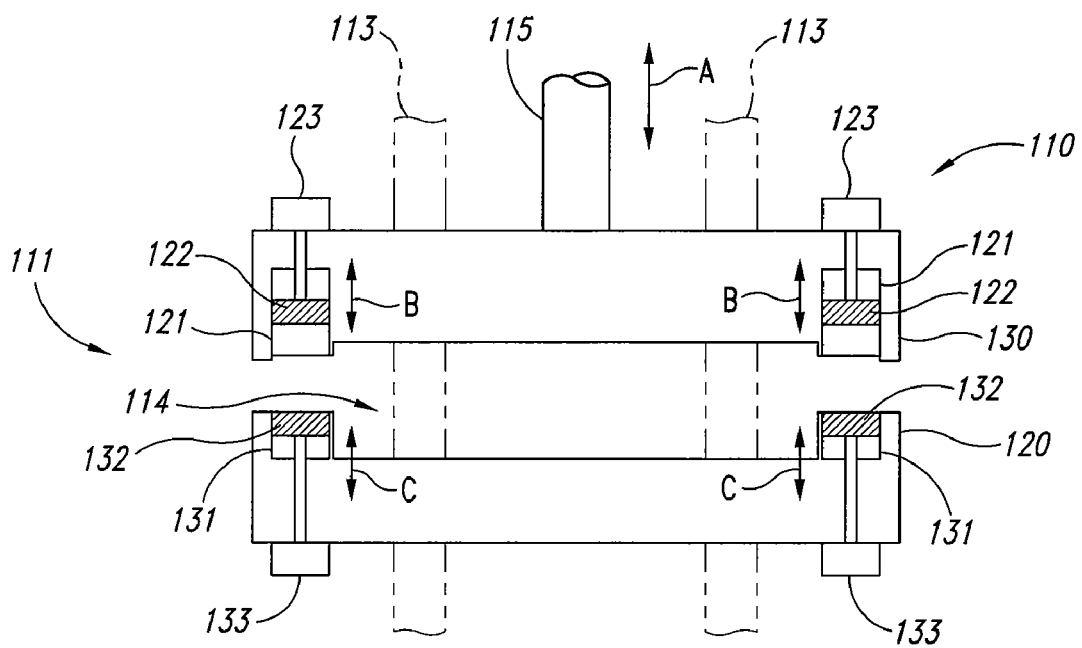
FIG. 2B is a partially schematic, cross-sectional side view of the tool shown in FIG. 2A.

FIG. 2B schematically illustrates a cross-sectional side view of the tool 110 shown in FIG. 2A. As shown in FIG. 2B, the mold 111 includes a first mold element 120 and a second mold element 130, with the mold cavity 114 defined at least in part by one or both of the mold elements 120, 130. The second mold element 130 is driven by the mold actuator 115 toward and away from the first mold element 120, as indicated by arrow A. The second mold element 130 also houses the overflow chambers 121, each of which includes an overflow piston 122 coupled to an overflow actuator 123 that drives the overflow piston 122 as indicated by arrows B. Accordingly, the overflow piston 122 can operate as the second pressurizing device described above.

The first mold element 120 can also include (optional) flash receptacles 131 that are aligned with the overflow chambers 121. Each flash receptacle 131 can include a flash piston 132 coupled to a flash actuator 133, which drives the flash piston 132 as indicated by arrow C. In operation, a semiconductor workpiece and encapsulant are placed in the mold cavity 114. The mold actuator 115 drives the second mold element 130 toward the first mold element 120 to distribute the encapsulant and force some of the encapsulant into the overflow chambers 121. The overflow pistons 122 are then actuated to pressurize the encapsulant in the overflow chambers 121, which in turn pressurizes the encapsulant in the mold cavity 114. Optionally, the overflow piston 122 and the flash piston 132 are then used to separate flash in the overflow chambers 121 from the encapsulated workpiece in the mold cavity 114. Further details of this process are described below with reference to FIGS. 3-8.

Figure 3:
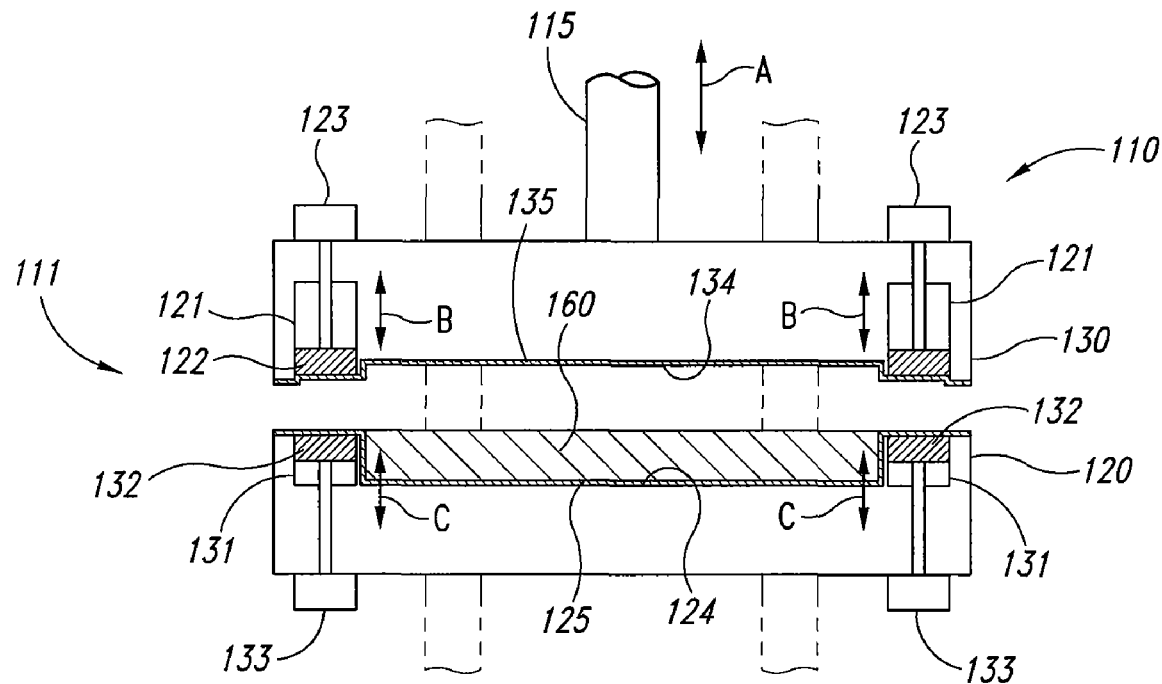
FIG. 3 is a partially schematic, cross-sectional side view of the tool shown in FIG. 2B with a semiconductor workpiece positioned for encapsulation in accordance with an embodiment of the invention.

FIG. 3 illustrates the tool 110 as it is prepared for an encapsulation process conducted in accordance with an embodiment of the invention. A first or lower releasable film 125 is disposed adjacent to a first surface 124 of the first mold element 120, and a corresponding second or upper film 135 is disposed adjacent a second surface 134 of the second mold element 130. A semiconductor workpiece 160 is positioned adjacent to the lower film 125. For purposes of illustration, the semiconductor workpiece 160 shown in FIG. 3 is a wafer, e.g., a 100 mm, 200 mm, 300 mm, or other size wafer. In other embodiments, the semiconductor workpiece 160 can include dies singulated from such a wafer, or the semiconductor workpiece 160 can include other semiconductor structures.

The overflow chamber 121 and the flash receptacle 131 are closed prior to the encapsulation process. Accordingly, the overflow actuator 123 drives the overflow piston 122 so that it is positioned against the upper film 135. The flash actuator 133 drives the flash piston 132 so that it is positioned against the lower film 125.

Figure 4:
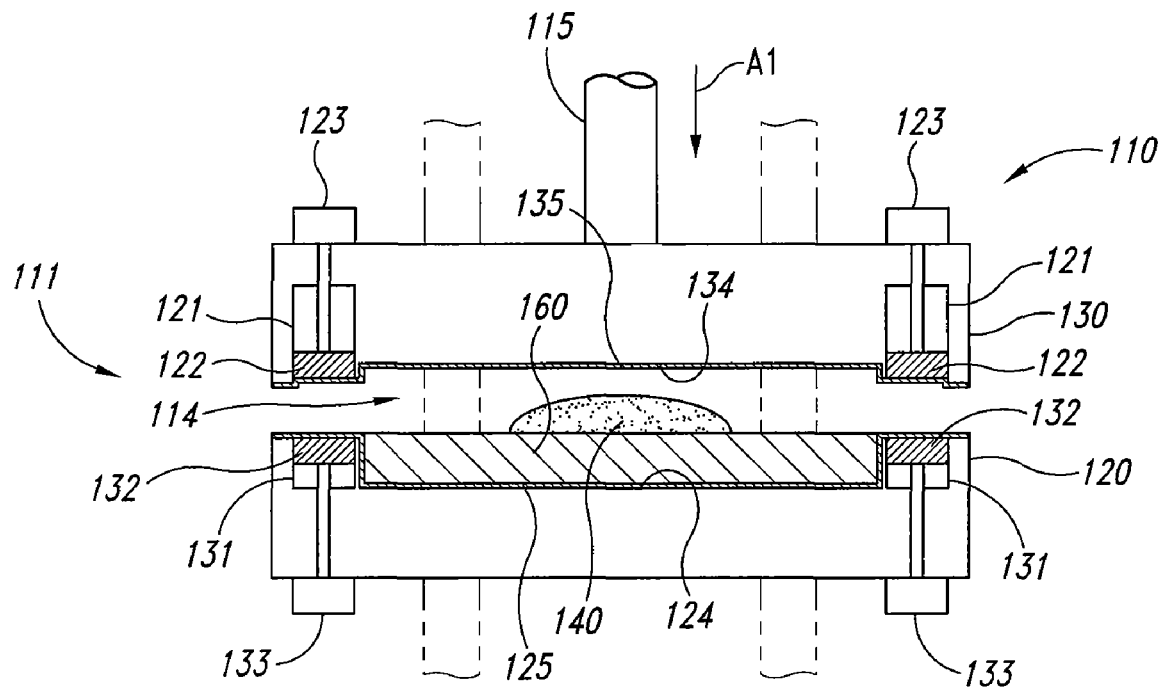
FIG. 4 is a partially schematic, cross-sectional side view of the tool shown in FIG. 3 with an encapsulant disposed adjacent to the workpiece in accordance with an embodiment of the invention.

In FIG. 4, a volume of encapsulant 140 has been placed on the semiconductor workpiece 160 within the mold cavity 114. The encapsulant 140 can be placed on the semiconductor workpiece 160 after the workpiece 160 is placed in the mold cavity 114, or the encapsulant 140 can be placed on the semiconductor workpiece 160 prior to positioning the workpiece 160 and the encapsulant together in the mold cavity 114. In either arrangement, a sufficient amount of encapsulant 140 is placed in the mold cavity 114 to provide the desired coating thickness over the workpiece 160, plus at least some excess encapsulant to ensure that the target surface (or surfaces) of the workpiece 160 facing away from the first mold element 120 are completely covered. In a particular embodiment, the upwardly facing surface of the workpiece 160 shown in FIG. 4 is the target surface, and the sides and downwardly facing surface are protected from exposure to the encapsulant 140 by the lower releasable film 125. In other embodiments, these surfaces may also be encapsulated. The second mold element 130 is then moved toward the first mold element 120, as indicated by arrow A1. Of course, it will be understood that in other embodiments, the first mold element 120 can be driven toward the second mold element 130, or both mold elements 120, 130 can be driven toward each other.

Figure 5:
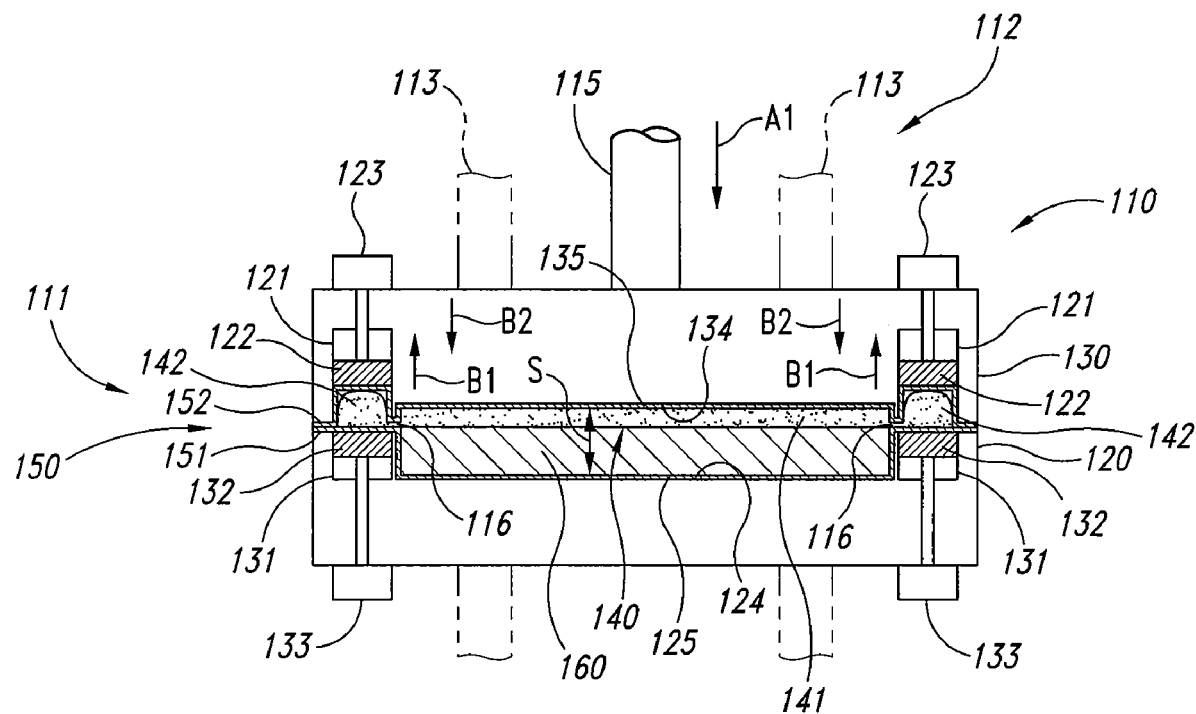
FIG. 5 is a partially schematic, cross-sectional side view of the tool shown in FIG. 4 with the encapsulant distributed over the workpiece in accordance with an embodiment of the invention.

FIG. 5 illustrates the tool 110 after the second mold element 130 has moved to its furthest extent toward the first mold element 120, as indicated by arrow A1. In this position, the motion of the second mold element 130 is halted by a stop 150. In a particular embodiment shown in FIG. 5, the stop 150 includes a first feature 151 carried by the first mold element 120, and a second feature 152 carried by the second mold element 130. The first and second features 151, 152 contact and/or engage each other to prevent further relative motion between the first mold element 120 and the second mold element 130. In the illustrated embodiment, the first feature 151 and the second feature 152 include flat, bearing surfaces of the first mold element 120 and the second mold element 130, respectively, covered by the first film 125 and the second film 135, respectively. In other embodiments, the first and second features 151, 152 can include other structures, and can be carried by structures other than the first mold element 120 and the second mold element 130. For example, one of the first and second features 151, 152 can be carried by the guide structure 112. In any of these embodiments, the portions of the first and second films 125, 135 at the outer edges of the mold 111 can press against each other, forming a tight seal that prevents egress of the encapsulant 140.

As the second mold element 130 moves toward the first mold element 120, it contacts the flowable encapsulant 140 and distributes the encapsulant 140 over the workpiece 160. It also drives at least some of the encapsulant 140 outwardly through flow communication channels or ports 116 (positioned between the second mold element 130 and the first mold element 120), and into the overflow chambers 121. As the encapsulant 140 is driven outwardly, a portion of the encapsulant (e.g., a workpiece encapsulant 141) remains in the mold cavity 114, and other portions (e.g., overflow encapsulant 142) enter the overflow chambers 121. As the overflow encapsulant 142 enters the overflow chambers 121, it drives the overflow pistons 122 upwardly, as indicated by arrow B1, thereby increasing the volumes of overflow chambers 121 accessible to the encapsulant 140. Optionally, the overflow actuators 123 can be driven so as to assist the motion of the overflow pistons 122. However, in at least one embodiment, the overflow actuators 123 are disengaged or otherwise configured so as not to restrict the motion of the overflow pistons 122. Accordingly, the force provided by the overflow encapsulant 142 drives the overflow pistons 122 upwardly. At the same time, the flash pistons 132 can remain in the position shown in FIG. 5 so that the overflow encapsulant 142 enters only the overflow chambers 121 and not the flash chambers 131.

When the relative motion between the first mold element 120 and the second mold element 130 is halted by the stop 150, a spacing S between the first film 125 and the second film 135 has a desired value corresponding to the combined thickness of the workpiece 160 and the overlying workpiece encapsulant 141. The stop 150 is accordingly arranged to repeatedly and consistently maintain the spacing S over many cycles so that the thickness of the workpiece encapsulant 141 remains consistent from one workpiece 160 to the next.

With the spacing S fixed, the same mold 111 can be used even if the characteristics of the semiconductor workpiece 160 change from one encapsulation process to another. For example, if the semiconductor workpiece 160 is missing certain dies (as is the case with a repopulated substrate), the same mold 111 can still be used, but with an additional amount of encapsulant 140 to account for the missing dies. In another arrangement, the spacing S can be adjusted (by adjusting the stop 150) to accommodate different workpieces 160. For example, if the workpieces 160 include stacked dies, or for some other reason have an overall thickness that is greater or less than a particular "base" thickness, then the spacing S can be adjusted to accommodate the changed thickness.

After the encapsulant 140 has been distributed over the workpiece 160, and relative motion of the first and second mold elements 120, 130 is arrested, the workpiece encapsulant 141 within the mold cavity 114 is pressurized or compacted. In the illustrated embodiment, the compaction process is performed by the overflow pistons 122. The overflow pistons 122 are driven downwardly as indicated by arrows B2, which pressurizes the overflow encapsulant 142. The pressurized overflow encapsulant 142 in turn pressurizes the workpiece encapsulant 141 via the flow channels 116. Because the encapsulant 140 is generally incompressible, the overflow pistons 122 move by only a very small amount while still generating a high pressure within the mold cavity 114. The elevated pressure in the mold cavity 114 can reduce or eliminate microvoids and/or other irregularities in the workpiece encapsulant 141. After the compaction process has been completed, the encapsulant 140 (e.g., both the workpiece encapsulant 141 and the overflow encapsulant 142) are cooled and/or cured or otherwise hardened prior to removing the encapsulated workpiece 160 from the mold 111.

Figure 6:
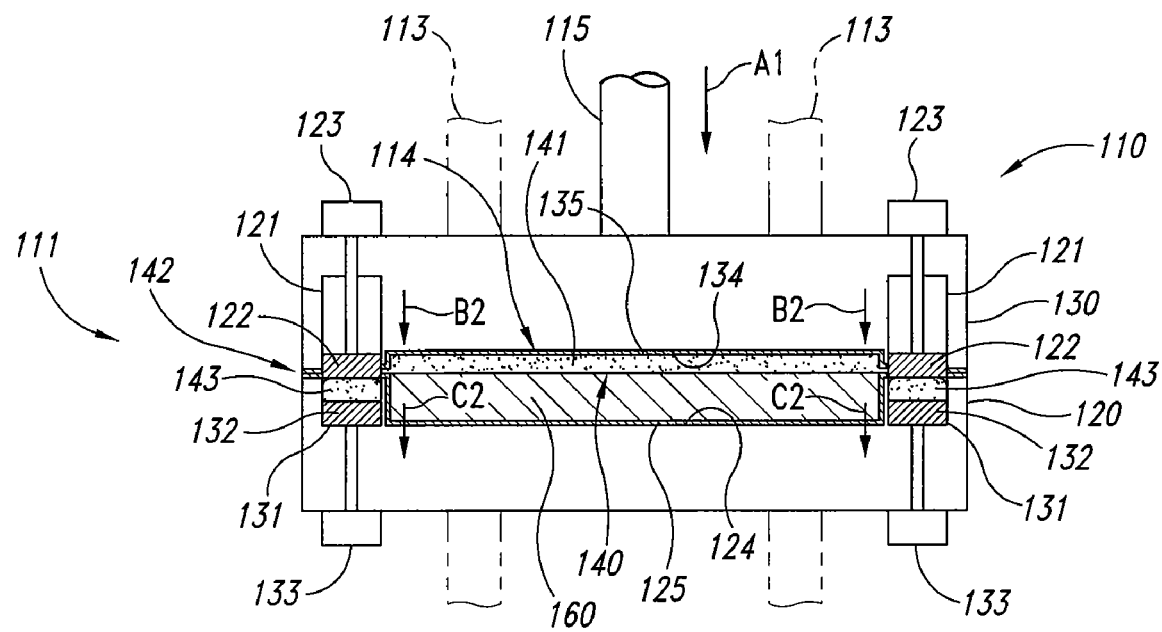
FIG. 6 is a partially schematic, cross-sectional side view of the tool and the workpiece after the encapsulant has been compressed and excess encapsulant has been removed in accordance with an embodiment of the invention.

FIG. 6 illustrates a process for removing the overflow encapsulant 142 from the encapsulated workpiece 160, and then removing the encapsulated workpiece 160 from the mold 111. To remove the overflow encapsulant 142, the overflow piston 122 is driven downwardly (as indicated by arrow B2) and the flash piston 132 is also either driven downwardly or allowed to move downwardly under the force provided by the overflow piston 121, as indicated by arrow C2. This motion severs the overflow encapsulant 142 (now solidified into flash 143) from the workpiece encapsulant 141. After the flash 143 has been removed, the second mold element 130 is moved away from the first mold element 120, and the encapsulated workpiece 160 is removed from the mold cavity 114.

Figure 7:
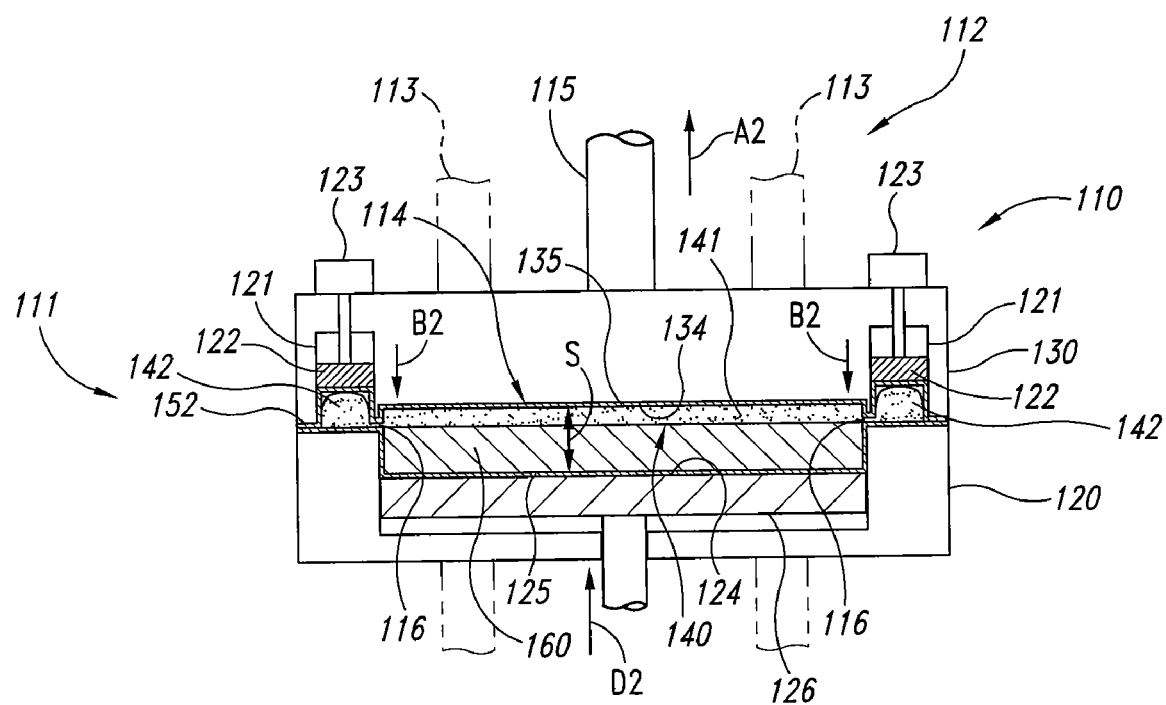
FIG. 7 is a partially schematic, cross-sectional side view of a tool configured to remove excess encapsulant in accordance with another embodiment of the invention.

FIG. 7 illustrates another arrangement for separating the overflow encapsulant 142 from the encapsulated semiconductor workpiece 160. In this arrangement, the mold cavity 114 is bounded in part by a cavity piston 126 housed in the first mold element 120. The lower film 125 is accordingly disposed adjacent to the cavity piston 126, which is shown in a recessed position in FIG. 7. After encapsulation, the mold actuator 115 can move the second mold element 130 upwardly, as indicated by arrow A2, while the overflow pistons 122 move downwardly to maintain the overflow encapsulant 142 in a fixed position. At the same time, the cavity piston 126 can move upwardly as indicated by arrow D2, (e.g., following the motion of the second mold element 130) so that the semiconductor workpiece 160 and the workpiece encapsulant 141 move upwardly as a unit and are separated from the overflow encapsulant 142. The cavity piston 126 can also be used (in addition to or in lieu of the adjustable stop 150 described above) to adjust the volume of the mold cavity 114 prior to encapsulation, so as to accommodate semiconductor workpieces 160 having different thicknesses or other characteristics.

Figure 8:
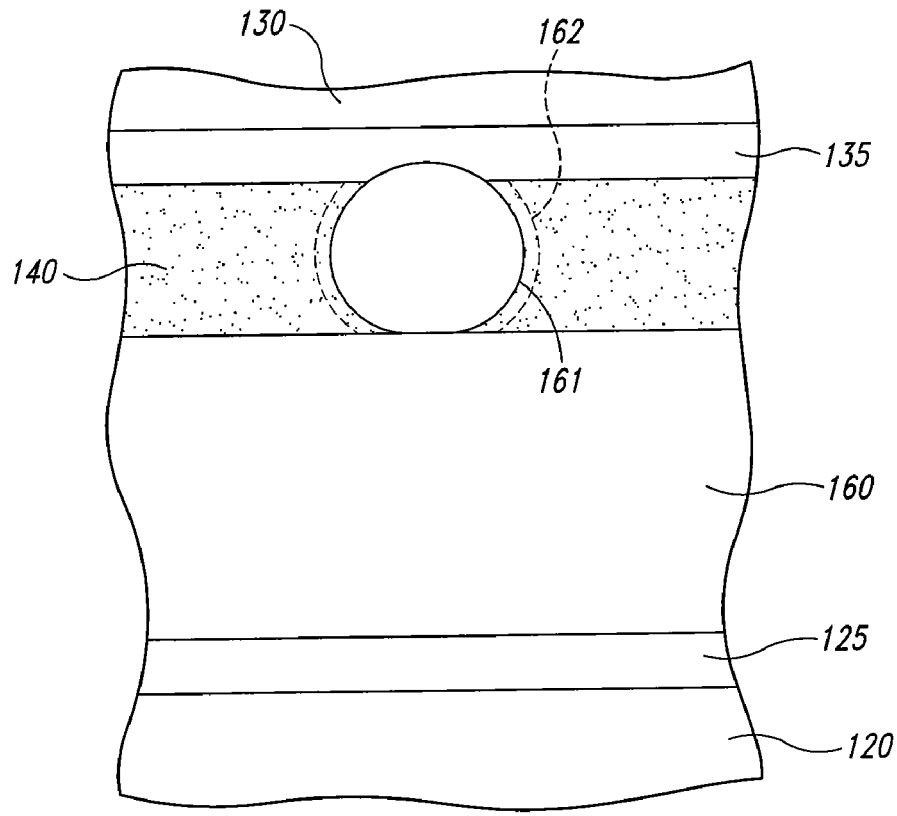
FIG. 8 is an enlarged, partially schematic, cross-sectional side view of the workpiece shown in FIGS. 6 and 7, illustrating a void collapsed in accordance with an embodiment of the invention.

FIG. 8 is an enlarged illustration of a small portion of the workpiece 160 while it is in the mold cavity 114, and after the encapsulant 140 has been compacted. As shown in FIG. 8, the workpiece 160 can include a solder ball 161 or other structure (e.g., conductive structure) that projects away from the workpiece 160. For purposes of illustration, only a single solder ball 161 is shown in FIG. 8, though it will be understood that the workpiece 160 will typically include many solder balls 161. The solder ball 161 can be connected to a through wafer interconnect (TWI) formed in the workpiece 160, or it can be connected to other conductive features of the workpiece 160. When the encapsulant 140 is initially disposed on the workpiece 160, a void 162 (e.g., a microvoid) may be present around the solder ball 161. As the second mold element 130 is driven toward the first mold element 120, the encapsulant 140 is spread out over the surface of the workpiece 160. In a particular arrangement, the solder ball 161 projects outwardly from the encapsulant 140 and is pressed into the upper film 135 as the overlying encapsulant 140 spreads out. This arrangement allows at least part of the solder ball 161 to be free of the encapsulant 140 and accessible for electrical coupling to other structures after the encapsulation process is completed. Once the motion of the second mold element 130 is halted, pressure is applied to the encapsulant 140 via the overflow piston 122 (FIG. 6) to collapse the void 162, thus reducing or eliminating the likelihood that the void will expand and burst or otherwise disrupt the integrity of the packaged workpiece 160.

In particular embodiments, the conductive structure includes a solder ball, as shown in FIG. 8. In other embodiments, the conductive structure includes other elements, for example, solder or other conductive material bumps, or wire bonds. The upper film 135 (and/or the lower film 125) can be formed from a suitable flexible material, including polytetrafluoroethylene, and can have a thickness selected to produce the desired degree of exposure for the conductive structure. For example, when the conductive structure includes a solder ball having a diameter of about 330 microns prior to reflow, and about 277 microns after reflow, the upper film 135 can have a thickness of about 200-250 microns, which is thicker than conventional release films, so as to accommodate the solder ball. The foregoing dimensions can have other values in other embodiments.

Several features of at least some of the foregoing embodiments can improve the effectiveness and/or efficiency of the encapsulation process. For example, placing the encapsulant on the semiconductor workpiece and then pressing the encapsulant to distribute it over the workpiece can be less likely to disrupt the integrity of solder balls or other structures than forcing the encapsulant over the workpiece in a conventional transfer mold process. In particular, the velocity of the encapsulant as it is pressed and distributed over the workpiece can be significantly less than the velocity of an encapsulant that is injected into a fixed shape mold cavity and around the workpiece. In addition, subsequently pressurizing the encapsulant can reduce microvoids or other discontinuities more effectively than can a conventional compression mold process.

Another feature of at least some of the foregoing embodiments is a cavity liner or film that receives portions of the conductive structures carried by the workpiece during an encapsulation process. This arrangement can allow the conductive structures to project outwardly from the encapsulant, without interfering with the coverage provided by the encapsulant over the surface of the workpiece. The portions of the conductive structures can therefore remain accessible for electrical connections to the workpiece after the encapsulated workpiece is removed from the mold. The cavity liner can also protect the surfaces of the mold from contaminants, e.g., to increase the lifespan of the mold and/or decrease the frequency with which the mold surfaces must be cleaned or otherwise serviced.

From the foregoing, it will be appreciated that specific embodiments of the invention have been described herein for purposes of illustration, but that various modifications may be made without deviating from the invention. For example, the upper mold is shown in the Figures as being movable relative to the lower mold, but in other embodiments, the lower mold can be movable relative to the upper mold, or both molds can be movable relative to each other. The encapsulant is shown as being disposed above the semiconductor workpiece in the Figures, but in other embodiments, the workpiece can be disposed above the encapsulant, for example, if the encapsulant includes a powder encapsulant. The workpiece and the mold cavity can have shapes other than those shown in the Figures and described above. The overflow chambers can also have different sizes, configurations, numbers and/or arrangements, depending upon features including, but not limited to, the size and shape of the mold cavity. The overflow chambers can be positioned in either one or both of the first and second mold portions. Devices other than pistons (e.g., pressurized bladders) can be used to pressurize the overflow encapsulant. Alternatively, such a bladder can be pressurized by a piston located remotely from the overflow chamber.

Certain aspects of the invention described in the context of particular embodiments may be combined or eliminated in other embodiments. For example, characteristics of the encapsulation process described above with reference to FIGS. 1-5 may be used in conjunction with the flash separation process described with reference to FIG. 7. While the aspect of receiving portions of projecting structures (e.g., solder balls) in a flexible liner material was described in the context of the particular molding process shown in the Figures, this technique may be applied to other molding processes in other embodiments, for example, otherwise conventional compression mold or transfer mold processes. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

I claim:

1. A method for encapsulating a semiconductor workpiece, comprising:
    placing a semiconductor workpiece and an encapsulant in a mold cavity, the mold cavity having an open position and a closed position;
    driving some of the encapsulant from the mold cavity to an overflow chamber;
    applying pressure to the encapsulant in the mold cavity via pressure applied to the encapsulant in the overflow chamber; and
    severing encapsulant in the overflow chamber from encapsulant in the mold cavity while the mold cavity is in the closed position and the overflow chamber is pressurized.

2. The method of claim 1 wherein placing a semiconductor workpiece and an encapsulant in a mold cavity includes placing the semiconductor workpiece proximate to a first mold element, placing the encapsulant adjacent to the semiconductor workpiece, and moving at least one of the first mold element and a second mold element toward the other to at least partially enclose the semiconductor workpiece and the encapsulant.

3. The method of claim 2 wherein driving some of the encapsulant from the mold cavity into the overflow chamber is performed by moving at least one of the first mold element and a second mold element toward the other.

4. The method of claim 1 wherein applying pressure to the encapsulant in the mold cavity includes collapsing voids in the encapsulant.

5. The method of claim 1 wherein driving some of the encapsulant includes driving individual portions of the encapsulant into corresponding individual overflow chambers.

6. A method for encapsulating a semiconductor workpiece, comprising:
disposing an encapsulant adjacent to a semiconductor workpiece;
moving at least one of a first mold element and a second mold element relative to the other with the first and second mold elements forming, at least in part, a mold cavity around the semiconductor workpiece;
forcing some of the encapsulant from the mold cavity into an overflow chamber as the at least one mold element moves relative to the other;
pressurizing the overflow chamber, wherein pressurizing the overflow chamber includes applying pressure to the encapsulant in the mold cavity; and
separating encapsulant in the overflow chamber from encapsulant in the mold cavity by moving at least a pressurized volume of the overflow chamber relative to the mold cavity.

7. The method of claim 6 wherein forcing some of the encapsulant into the overflow chamber includes applying a force on the encapsulant with the first or the second mold element.

8. The method of claim 6, further comprising controlling a spacing between the first and second mold elements to be at least approximately identical on successive encapsulation cycles for a corresponding succession of semiconductor workpieces.

9. The method of claim 8 wherein controlling the spacing between the first and second mold elements includes driving the at least one mold element into contact with a stop located at a fixed position relative to the other mold element.

10. The method of claim 6, further comprising stopping motion of the at least one mold element relative to the other at a predetermined location.

11. The method of claim 10 wherein stopping motion of the at least one mold element includes bearing the mold elements against each other.

12. The method of claim 6 wherein moving the at least one mold element includes distributing the encapsulant within the mold cavity.

13. The method of claim 12 wherein distributing the encapsulant includes directing the encapsulant adjacent to solder balls projecting from a surface of the semiconductor workpiece.

14. The method of claim 6 wherein applying pressure to the encapsulant in the mold cavity includes applying pressure via a communication port between the overflow chamber and the mold cavity.

15. The method of claim 6 wherein applying pressure includes moving a piston that is in fluid communication with the overflow chamber.

16. The method of claim 6 wherein applying pressure includes moving a piston within the overflow chamber.

17. The method of claim 16, wherein forcing some of the encapsulant from the mold cavity includes pressing the encapsulant against the piston, moving the piston, and increasing a volume of the overflow chamber bounded by the piston.

18. The method of claim 16 wherein moving the piston includes moving the piston in a first direction, and wherein the method further comprises moving the piston in a second direction opposite the first direction at least until the piston separates the encapsulant in the overflow chamber from the encapsulant in the mold cavity.

19. The method of claim 18, further comprising at least partially hardening the encapsulant in the overflow chamber before separating the encapsulant in the overflow chamber from the encapsulant in the mold cavity.

20. The method of claim 6 wherein:
the overflow chamber is bounded by a first piston on a first side and a second piston on a second side;
pressuring the overflow chamber comprises forcing at least the first piston toward the encapsulant; and wherein separating encapsulant in the overflow chamber comprises moving at least the second piston.

21. The method of claim 20 wherein the first piston and the second piston are generally aligned along a common axis.

22. The method of claim 6 wherein the mold cavity has a generally circular shape, and wherein forcing some of the encapsulant from the mold cavity includes forcing individual portions of the encapsulant into corresponding overflow chambers positioned around a periphery of the mold cavity.

23. The method of claim 6 wherein disposing an encapsulant adjacent to a semiconductor workpiece includes disposing the encapsulant adjacent to a generally circular semiconductor wafer having multiple semiconductor dies.

24. The method of claim 6 wherein disposing an encapsulant adjacent to a semiconductor workpiece includes disposing the encapsulant adjacent to a singulated semiconductor die.

25. The method of claim 6, further comprising driving solder balls carried by the semiconductor workpiece through the encapsulant and into a flexible liner in the mold cavity as the at least one mold element moves relative to the other.

26. The method of claim 6 wherein:
the semiconductor workpiece includes a generally circular wafer;
moving at least one of the first and second mold elements relative to the other includes driving the at least one mold element into contact with a stop located at a fixed position relative to the other mold element; and wherein applying pressure to the encapsulant includes moving a piston within the overflow chamber and collapsing cavities in the encapsulant in the mold cavity.

27. A method for encapsulating a semiconductor workpiece, comprising:
placing a semiconductor workpiece in a mold cavity; introducing an encapsulant into the mold cavity and adjacent to the workpiece; pressing an overflow portion of the encapsulant from the mold cavity into an overflow chamber; pressing conductive elements projecting from a surface of the workpiece into a flexible material at a wall of the mold cavity and out of the encapsulant, separating the overflow portion in the overflow chamber from the encapsulant within the mold cavity by moving the overflow chamber relative to the mold cavity while the mold cavity is in a closed position and the overflow chamber is pressurized; and
removing the flexible material from the conductive elements.

28. The method of claim 27 wherein pressing conductive elements includes pressing volumes of solder.

29. The method of claim 27 wherein pressing conductive elements includes pressing solder balls.

30. The method of claim 27 wherein pressing conductive elements includes pressing conductive bumps.

31. The method of claim 27 wherein pressing conductive elements includes pressing conductive elements into a flexible film.

32. The method of claim 31 wherein pressing conductive elements includes pressing conductive elements into a flexible film having a thickness of at least 200 microns.

33. The method of claim 27, further comprising:
removing the workpiece from the mold cavity after encapsulation; and
removing the flexible material from the mold cavity prior to encapsulating a subsequent workpiece.

34. The method of claim 27 wherein pressing conductive elements includes moving a first portion of a mold relative to a second portion of the mold, the first and second portions of the mold bounding, at least in part, the mold cavity.

35. The method of claim 6 wherein moving the overflow cavity relative to the mold cavity comprises moving the mold cavity while the overflow chamber remains stationary.

36. A method for encapsulating a semiconductor workpiece, comprising:
placing a semiconductor workpiece and an encapsulant in a mold cavity, the mold cavity having an open position and a closed position;
driving some of the encapsulant from the mold cavity to an overflow chamber;
applying pressure to the encapsulant in the mold cavity via pressure applied to the encapsulant in the overflow chamber; and
severing encapsulant in the overflow chamber from encapsulant in the mold cavity while maintaining each of the overflow chamber and the mold cavity at a constant interior volume.

* * * * *